(12) United States Patent
Kim

(10) Patent No.: US 12,526,997 B2
(45) Date of Patent: Jan. 13, 2026

(54) MEMORY DEVICE AND MANUFACTURING METHOD OF THE MEMORY DEVICE

(71) Applicant: SK hynix Inc., Icheon-si (KR)

(72) Inventor: Jin Ha Kim, Icheon-si (KR)

(73) Assignee: SK hynix Inc., Gyeonggi-do (KR)

( * ) Notice: Subject to any disclaimer, the term of this patent is extended or adjusted under 35 U.S.C. 154(b) by 416 days.

(21) Appl. No.: 18/106,923

(22) Filed: Feb. 7, 2023

(65) Prior Publication Data

US 2024/0081059 A1    Mar. 7, 2024

(30) Foreign Application Priority Data

Sep. 2, 2022    (KR) .......................... 10-2022-0111533

(51) Int. Cl.
*H10B 43/27*    (2023.01)
*H10B 41/27*    (2023.01)
*H10B 41/40*    (2023.01)
*H10B 43/40*    (2023.01)

(52) U.S. Cl.
CPC ............. *H10B 43/27* (2023.02); *H10B 41/27* (2023.02); *H10B 41/40* (2023.02); *H10B 43/40* (2023.02)

(58) Field of Classification Search
None
See application file for complete search history.

(56) References Cited

U.S. PATENT DOCUMENTS

| | | | |
|---|---|---|---|
| 2019/0006386 A1* | 1/2019 | Yamazaki | H10B 63/34 |
| 2020/0135759 A1* | 4/2020 | Choi | H10D 30/693 |
| 2020/0365615 A1* | 11/2020 | Shin | H10D 64/037 |
| 2021/0167083 A1* | 6/2021 | Kim | H01L 23/53271 |

FOREIGN PATENT DOCUMENTS

| | | |
|---|---|---|
| KR | 1020190135540 A | 12/2019 |
| KR | 1020210067352 A | 6/2021 |

* cited by examiner

*Primary Examiner* — Cory W Eskridge
(74) *Attorney, Agent, or Firm* — WILLIAM PARK AND ASSOCIATES LTD.

(57) ABSTRACT

A memory device, and a manufacturing method of the memory device, includes a stack structure including alternately stacked first and second material layers. The memory device also includes a vertical hole extending through the stack structure in a vertical direction, isolation patterns protruding from side surfaces of the first material layers formed inside the vertical hole, and a blocking layer formed along surfaces of the protruding isolation patterns and the second material layers. The memory device further includes a barrier layer formed along a surface of the blocking layer and charge trap layers formed between protrusion parts of the barrier layer.

11 Claims, 13 Drawing Sheets

MEMORY DEVICE AND MANUFACTURING METHOD OF THE MEMORY DEVICE

CROSS-REFERENCE TO RELATED APPLICATION

The present application claims priority under 35 U.S.C. § 119(a) to Korean patent application number 10-2022-0111533, filed on Sep. 2, 2022, in the Korean Intellectual Property Office, the entire disclosure of which is incorporated herein by reference.

BACKGROUND

1. Technical Field

The present disclosure generally relates to a memory device and a manufacturing method of the memory device, and more particularly, to a three-dimensional memory device and a manufacturing method of the three-dimensional memory device.

2. Related Art

Memory devices may be classified as volatile memory devices from which stored data is lost when the supply of power is interrupted or nonvolatile memory devices in which stored data is retained even when the supply of power is interrupted.

A nonvolatile memory device may include NAND flash memory, NOR flash memory, resistive random access memory (ReRAM), phase-change random access memory (PRAM), magnetoresistive random access memory (MRAM), ferroelectric random access memory (FRAM), spin transfer torque random access memory (STT-RAM), and the like.

A NAND flash memory system may include a memory cell array in which data is stored and peripheral circuits configured to perform a program, read, or erase operation in response to a command transmitted from a controller.

The memory cell array may include a plurality of memory blocks, and each of the plurality of memory blocks may include a plurality of memory cells.

SUMMARY

An embodiment is directed to a memory device, and a manufacturing method of the memory device, which can improve a degree of integration for the memory device.

An embodiment is also directed to a memory device, and a manufacturing method of the memory device, which can reduce a defect of the memory device and increase a process margin.

In accordance with an embodiment of the present disclosure, a memory device includes: a stack structure including alternately stacked first and second material layers; a vertical hole extending through the stack structure in a vertical direction; isolation patterns protruding from side surfaces of the first material layers formed inside the vertical hole; a blocking layer formed along surfaces of the protruding isolation patterns and the second material layers; a barrier layer formed along a surface of the blocking layer; and charge trap layers formed between protrusion parts of the barrier layer.

In accordance with another embodiment of the present disclosure, a method of manufacturing a memory device is provided. The method includes: forming a stack structure in which first material layers and second material layers are alternately stacked; forming a vertical hole through the stack structure by etching the stack structure; partially etching the first material layers exposed at an inner wall of the vertical hole; forming isolation patterns along the inner wall of the vertical hole, for which the first material layers are partially etched; forming a blocking layer along surfaces of the isolation patterns and the second material layers; forming a barrier layer along a surface of the blocking layer; forming a first charge trap layer along a surface of the barrier layer; and forming a second charge trap layer along surfaces of the first charge trap layer and the barrier layer.

BRIEF DESCRIPTION OF THE DRAWINGS

Example embodiments will now be described more fully hereinafter with reference to the accompanying drawings; however, they may be embodied in different forms and should not be construed as being limited to the embodiments set forth herein. Rather, these embodiments are provided so that this disclosure will be enabling to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

The specific structural or functional description disclosed herein is merely illustrative for the purpose of describing embodiments according to the concept of the present disclosure. The embodiments according to the concept of the present disclosure can be implemented in various forms, and should not be construed as being limited to the embodiments set forth herein.

Figure 1:
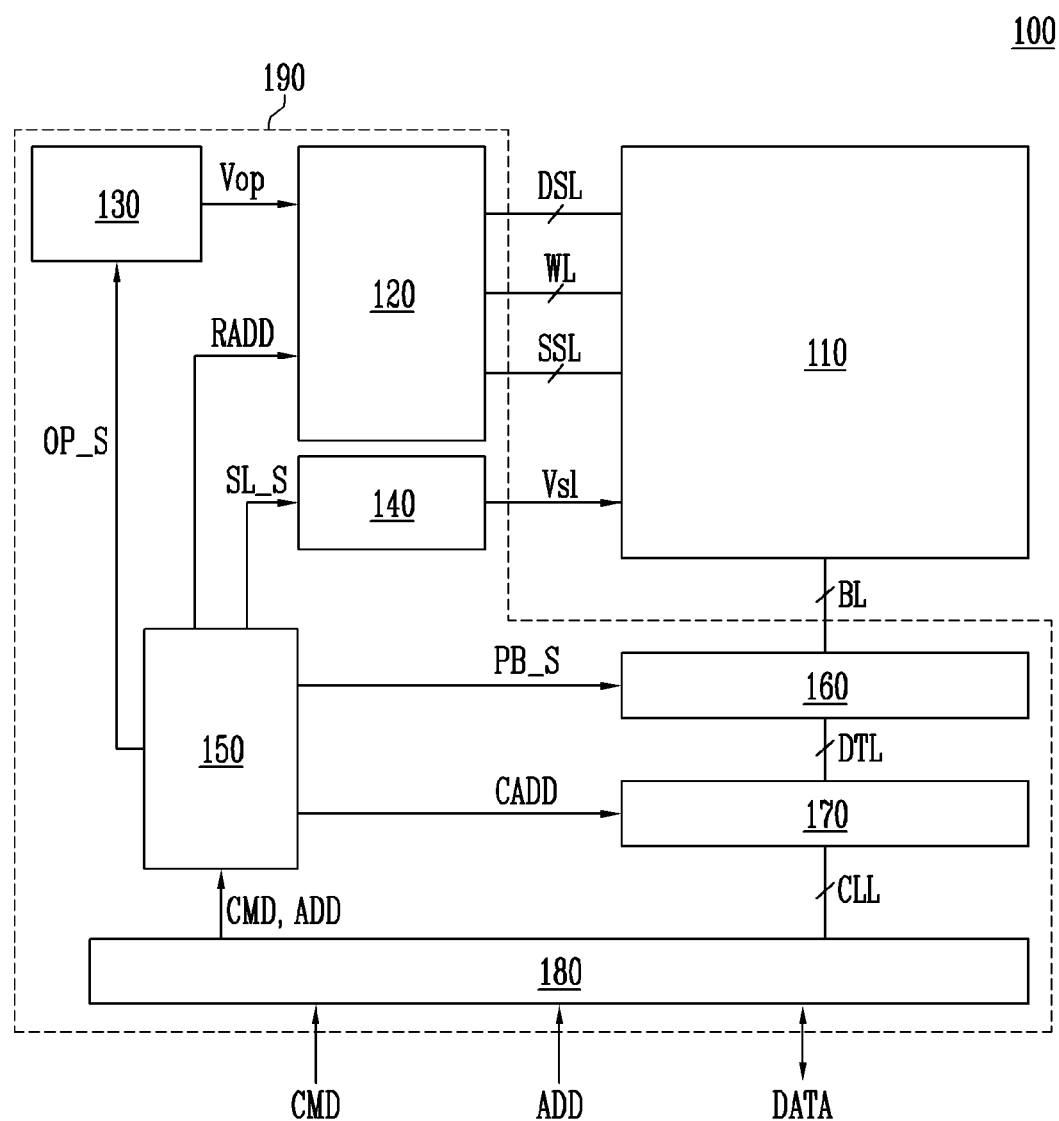
FIG. 1 is a diagram illustrating a memory device in accordance with an embodiment of the present disclosure.

FIG. 1 is a diagram illustrating a memory device in accordance with an embodiment of the present disclosure.

Referring to FIG. 1, the memory device 100 may include a peripheral circuit 190 and a memory cell array 110.

The peripheral circuit 190 may be configured to perform a program operation and a verify operation, which are used to store data, to perform a read operation for outputting data stored in the memory cell array 110, or to perform an erase operation for erasing data stored in the memory cell array 110. The peripheral circuit 190 may include a voltage generating circuit 130, a row decoder 120, a source line driver 140, a control circuit 150, a page buffer 160, a column decoder 170, and an input/output circuit 180.

The memory cell array 110 may include a plurality of memory cells in which data is stored. In an embodiment, the memory cell array 110 may be a three-dimensional memory cell array. The plurality of memory cells may store single-bit data or multi-bit data of two or more bits according to a programing manner. The plurality of memory cells may constitute a plurality of strings. Memory cells included in each of the strings may be electrically connected to each other through a channel. Channels included in the strings may be connected to the page buffer 160 through bit lines BL.

The voltage generating circuit 130 may generate various operating voltages Vop used for a program operation, a read operation, or an erase operation in response to an operation signal OP_S. For example, the voltage generating circuit 130 may selectively generate and output the operating voltages Vop including a program voltage, a verify voltage, a pass voltage, a read voltage, an erase voltage, and the like.

The row decoder 120 may be connected to the memory cell array 110 through a plurality of drain select lines DSL, a plurality of word lines WL, and a plurality of source select lines SSL. The row decoder 120 may transfer the operating voltages Vop to the plurality of drain select lines DSL, the plurality of word lines WL, and the plurality of source select lines SSL in response to a row address RADD.

The source line driver 140 may transmit a source voltage Vsl to the memory cell array 110 in response to a source line control signal SL_S. For example, the source voltage Vsl may be transferred to a source line connected to the memory cell array 110.

The control circuit 150 may output the operation signal OP_S, the row address RADD, the source line control signal SL_S, a page buffer control signal PB_S, and a column address CADD, in response to a command CMD and an address ADD.

The page buffer 160 may be connected to the memory cell array 110 through the bit lines BL. The page buffer 160 may temporarily store data DATA received through a plurality of bit lines BL in response to the page buffer control signal PB_S. The page buffer 160 may sense a voltage or current of the plurality of bit lines BL in a read operation.

The column decoder 170 may transmit data DATA input from the input/output circuit 180 to the page buffer 160 or transmit data DATA stored in the page buffer 160 to the input/output circuit 180, in response to the column address CADD. The column decoder 170 may exchange data DATA with the input/output circuit 180 through column lines CLL, and exchange data DATA with the page buffer 160 through data lines DTL.

The input/output circuit 180 may transfer, to the control circuit 150, a command CMD and an address ADD, which are transferred from an external device (e.g., a controller) connected to the memory device 100, and output data received from the column decoder 170 to the external device.

Figure 2:
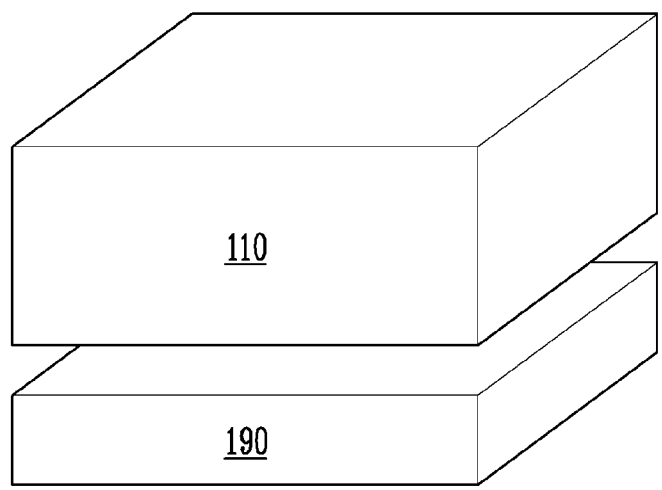
FIG. 2 is a diagram illustrating an arrangement structure of a memory cell array and a peripheral circuit.
Figure 2:
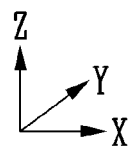

FIG. 2 is a diagram illustrating an arrangement structure of the memory cell array 110 and the peripheral circuit 190.

Referring to FIG. 2, the memory cell array 110 may be stacked above the peripheral circuit 190. For example, when a substrate forms an X-Y plane, the peripheral circuit 190 may be stacked in a Z direction from the substrate, and the memory cell array 110 may be stacked above the peripheral circuit 190.

Figure 3:
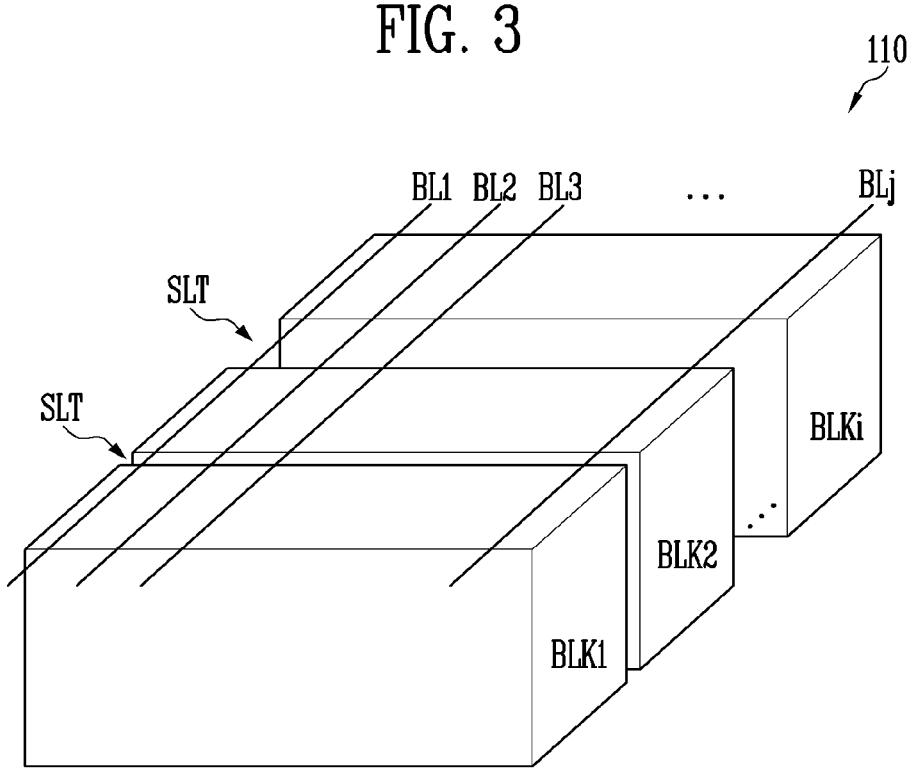
FIG. 3 is a diagram illustrating a structure of the memory cell array.

FIG. 3 is a diagram illustrating a structure of the memory cell array 110.

Referring to FIG. 3, the memory cell array 110 may include first to ith memory blocks BLK1 to BLKi (i is a positive integer). The first to ith memory blocks BLK1 to BLKi may be arranged to be spaced apart from each other along a Y direction, and be commonly connected to first to jth bit lines BL1 to BLj. For example, the first to jth bit lines BL1 to BLj may extend along the Y direction, and be disposed to be spaced apart from each other along an X direction. The first to ith memory blocks BLK1 to BLKi may be isolated from each other by a slit SLT.

Figure 4:
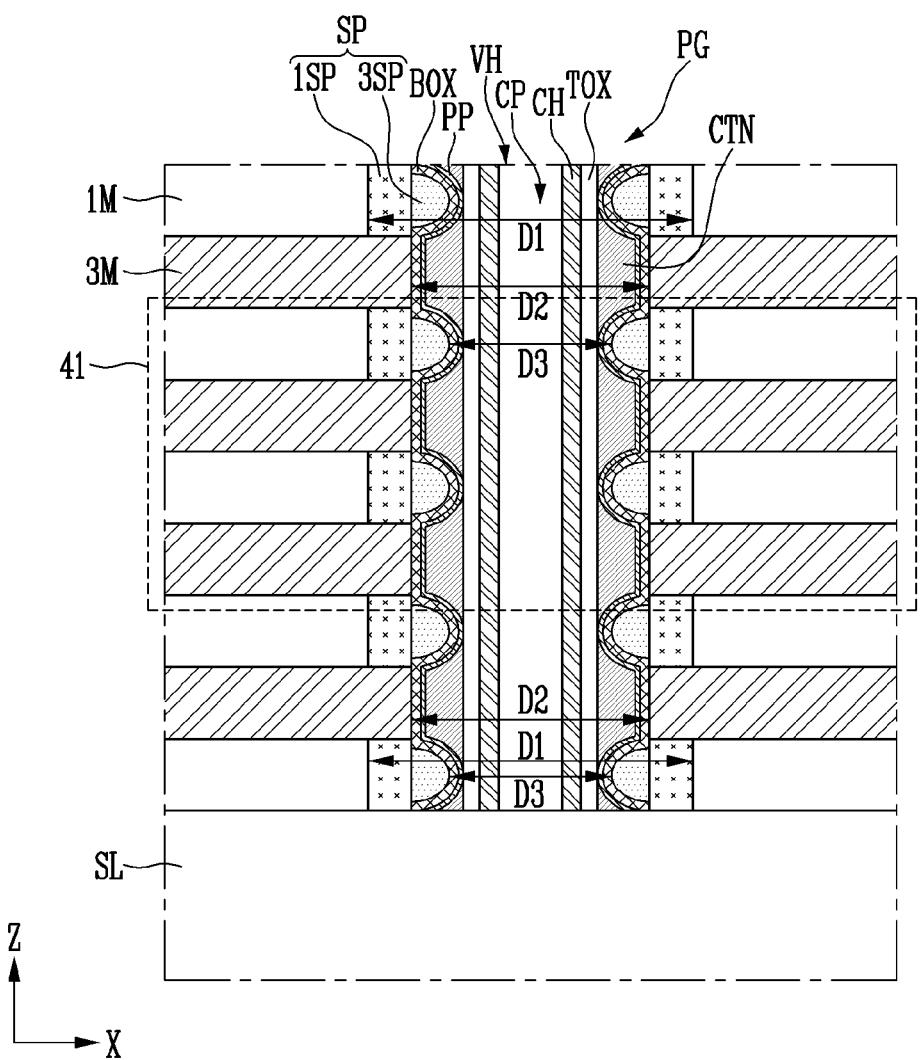
FIG. 4 is a sectional view illustrating a structure of a memory device in accordance with an embodiment of the present disclosure.

FIG. 4 is a sectional view illustrating a structure of a memory device in accordance with an embodiment of the present disclosure.

Referring to FIG. 4, a stack structure in which first material layers 1M and third material layers 3M are alternately stacked may be formed on the top of a source line SL. The first material layers 1M may be located at an uppermost end and a lowermost end of the stack structure in which the first material layers 1M and the third material layers 3M are alternately stacked. The stack structure may include a vertical hole VH formed in a first direction (e.g., the Z direction) vertical to the stack structure and a plug PG formed along the inside of the vertical hole VH. For convenience of recognition, FIG. 4 illustrates, as an example, one plug PG among a plurality of plugs included in the stack structure, and illustration of the other plugs is omitted. Also, FIG. 4 illustrates a lower portion of the plug PG to describe in detail the structure of an inner wall of the plug PG. Although not shown in the drawing, a capping layer may be formed on the top of a core pillar CP formed in the plug PG, and a channel layer CH of the plug PG may be connected to bit lines through bit line contacts connected to the capping layer.

A structure in which the channel layer CH of the plug PG is connected to the source line SL is not limited to the structure shown in the drawing. The channel layer CH of the plug PG may be connected to the source line SL in various manners.

The first material layers 1M may be arranged adjacent to each other to be spaced apart from each other in the first direction (e.g., the Z direction) vertical to the stack structure with the third material layers 3M interposed therebetween. Also, each of the first material layers 1M may be disposed to be spaced apart from another first material layer 1M in a second direction (e.g., the X direction) in which the first material layer 1M extends, with the plug PG interposed therebetween. An inner wall of each of the first material layers 1M may be disposed to be in contact with each of first isolation patterns 1SP. Because the first material layers 1M are disposed to be spaced apart from each other with the plug PG interposed therebetween, the inner walls of the first material layers 1M may be disposed to be spaced apart from each other in a structure in which the inner walls of the first material layers 1M face each other with the plug PG and first and third isolation patterns 1SP and 3SP interposed therebetween.

The third material layers 3M may be arranged adjacent to each other to be spaced apart from each other in the first direction (e.g., the Z direction) vertical to the stack structure with the first material layers 1M interposed therebetween. Also, each of the third material layers 3M may be disposed to be spaced apart from another third material layer 3M in the second direction (e.g., the X direction) in which the third material layer 3M extends, with the plug PG interposed therebetween. An inner wall of each of the third material layers 3M may be disposed to be in contact with a blocking layer BOX of the plug PG. Because the third material layers 3M are disposed to be spaced apart from each other with the plug PG interposed therebetween, the inner walls of the third material layers 3M may be disposed to be spaced apart from each other in a structure in which the inner walls of the third material layers 3M face each other with the plug PG interposed therebetween.

A distance D1 between an inner wall of each of the first material layers 1M and an inner wall of another first material layer 1M which the first material layer 1M faces may be formed longer than a second distance D2 between an inner wall of each of the third material layers 3M and an inner wall of another third material layer 3M which the third material layer 3M faces. That is, the inner walls of the first material layers 1M may be formed more distant from the vertical hole VH than the inner walls of the third material layers 3M. For example, the inner walls of the first material layers 1M may be formed more distant from the vertical hole VH than the inner walls of the third material layers 3M in the second direction (e.g., the X direction) intersecting the first direction.

The first isolation patterns 1SP may be disposed to be in contact with the inner walls of the first material layers 1M and to be in contact with outer walls of the third isolation patterns 3SP. Because the first isolation patterns 1SP are in contact with the inner walls of the first material layers 1M, the first isolation patterns 1SP may be disposed to be spaced apart from each other in the first direction (e.g., the Z direction) vertical to the third material layers 3M with the third material layers 3M interposed therebetween. The first isolation patterns 1SP may be disposed to be spaced apart from each other while facing each other in the second direction (e.g., the X direction) as the direction in which the first material layers 1M extend, with the plug PG interposed therebetween. A distance between an inner wall of each of the first isolation patterns 1SP at a side close to the plug PG and an inner wall of another first isolation pattern 1SP which the first isolation pattern 1SP faces may be formed to overlap with the distance D2 between the inner wall of each of the third material layers 3M and the inner wall of the another third material layer 3M which the third material layer 3M faces. In an embodiment, a difference between the distance between the inner wall of each of the first isolation patterns 1SP at the side close to the plug PG and the inner wall of the another first isolation pattern 1SP which the first isolation pattern 1SP faces and the distance D2 between the inner wall of each of the third material layers 3M and the inner wall of the another third material layer 3M which the third material layer 3M faces may be formed within 4 nm.

The third isolation patterns 3SP, which protrude to become close to the vertical hole in the second direction (e.g., the X direction) in which the first material layers 1M extend from the inner walls of the first isolation patterns 1SP, may be formed. The third isolation patterns 3SP may be in contact with the inner walls of the first isolation patterns 1SP, and be formed between the first isolation pattern 1SP and the blocking layer BOX. The third isolation patterns 3SP may be disposed to be spaced apart from each other in the first direction (e.g., the Z direction) vertical to the third material layers 3M with the third material layers 3M interposed therebetween. The third isolation patterns 3SP may be disposed to be spaced apart from each other while facing each other in the second direction (e.g., the X direction) as the direction in which the first material layers 1M extend, with the plug PG interposed therebetween. Because the third isolation patterns 3SP is formed in a structure protruding in the second direction to become close to the vertical hole VH, a distance D3 between an inner wall of each of the third isolation pattern 3SP and an inner wall of another third isolation pattern 3SP which the third isolation pattern 3SP faces may be formed shorter than the distance D2 between the inner wall of each of the third material layers 3M and the inner wall of the another third material layer 3M which the third material layer 3M faces. The inner walls of the third isolation patterns 3SP are formed in a structure protruding as compared with the third material layers 3M, and the shape of the inner walls of the third isolation patterns 3SP is not limited to a semicircular shape. For example, the shape of the inner walls of the third isolation patterns 3SP may be variously formed in a rectangular shape, a round shape, and the like.

The blocking layer BOX may be formed along the inner walls of the third isolation patterns 3SP and the inner walls of the third material layers 3M. The blocking layer BOX may be formed in a structure protruding toward the vertical hole VH in the second direction (e.g., the X direction) in which the first material layers 1M extend. The blocking layer BOX may be formed of an insulating material. For example, the blocking layer BOX may be formed of silicon oxide or other oxide.

Barrier layers PP may be formed along an inner wall of the blocking layer BOX. Like the blocking layer BOX, the barrier layer PP may be formed in a structure protruding toward the vertical hole VH in the second direction (e.g., the X direction) in which the first material layers 1M extend. The barrier layer PP may be used to protect the first and third isolation patterns 1SP and 3SP and the blocking layer BOX in an etching process of removing portions of charge trap layers CTN. Therefore, the barrier layer PP may be formed of a material having an etch selectivity lower than an etch selectivity of the charge trap layers CTN. For example, the barrier layer PP may be formed of silicon oxycarbide (SiOC) for which the etching velocity is slower than an etching velocity of the charge trap layers CTN in a wet etching process using hydrogen fluoride (HF).

The charge trap layers CTN may be formed between protrusion parts of the barrier layer PP, which protrude toward the vertical hole VH. The charge trap layers CTN may be arranged to be spaced apart from each other in the first direction (e.g., the Z direction) vertical to the first material layers 1M with the protrusion parts of the barrier layer PP, which are interposed therebetween. The protrusion parts of the barrier layer PP are formed by the third isolation patterns 3SP. Because the charge trap layers CNT are formed between protrusion structures formed by inner walls of the third isolation pattern 3SP, the blocking layer BOX, and the barrier layer PP, a thickness of the charge trap layers CTN may correspond to a thickness of the protrusion part formed by the third isolation pattern 3SP, the blocking layer BOX, and the barrier layer PP. For example, a distance between each of the charge trap layers CTN and another charge trap layer CTN which the charge trap layer CTN faces may be formed to overlap with a distance between a protrusion part of each of the barrier layers PP and a protrusion part of another barrier layer PP which the barrier layer PP faces. In an embodiment, a difference between the distance between each of the charge trap layers CTN and the another charge trap layer CTN which the charge trap layer CTN faces and the distance between the protrusion part of each of the barrier layers PP and the protrusion part of the another barrier layer PP which the barrier layer PP faces may be formed within 3 nm. The charge trap layers CTN may be formed of a material capable of storing charges. For example, the charge trap layers CTN may be formed of a nitride layer.

A tunnel insulating layer TOX may be formed along inner walls of the charge trap layers CTN and the barrier layer PP. Because the charge trap layers CTN are formed between the protrusion parts of the barrier layer PP, the tunnel insulating layer TOX may be formed in an approximately linear shape in the first direction (e.g., the Z direction) vertical to the first material layers 1M. The tunnel insulating layer TOX may be formed of an insulating material, e.g., an oxide layer or a silicon oxide layer. The channel layer CH may be formed along an inner wall of the tunnel insulating layer TOX. The channel layer CH may be formed of a conductive material, e.g., a poly-silicon layer. The core pillar CP may be formed inside the vertical hole VH and be surrounded by the channel layer CH. For example, the core pillar CP may be formed of a conductive material or an insulating material.

Figure 5A:
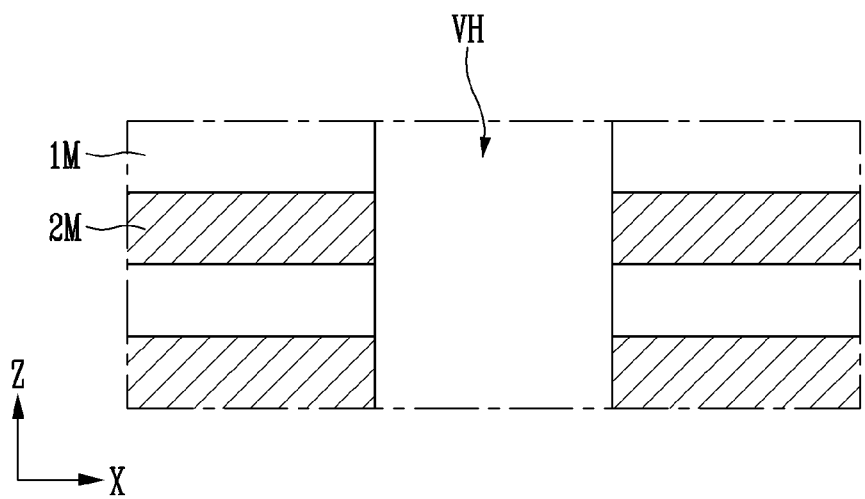
FIGS. 5A to 5O are sectional views illustrating a manufacturing method of a memory device in accordance with an embodiment of the present disclosure.
Figure 5B:
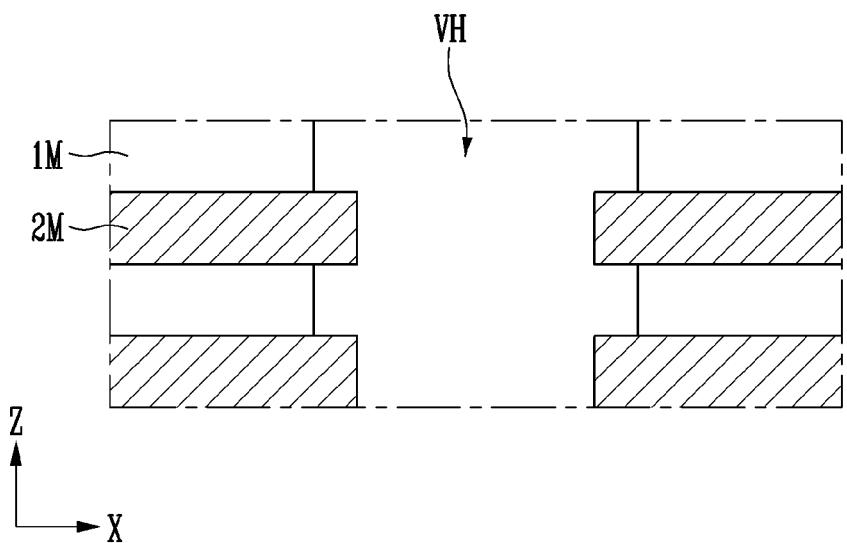
Figure 5C:
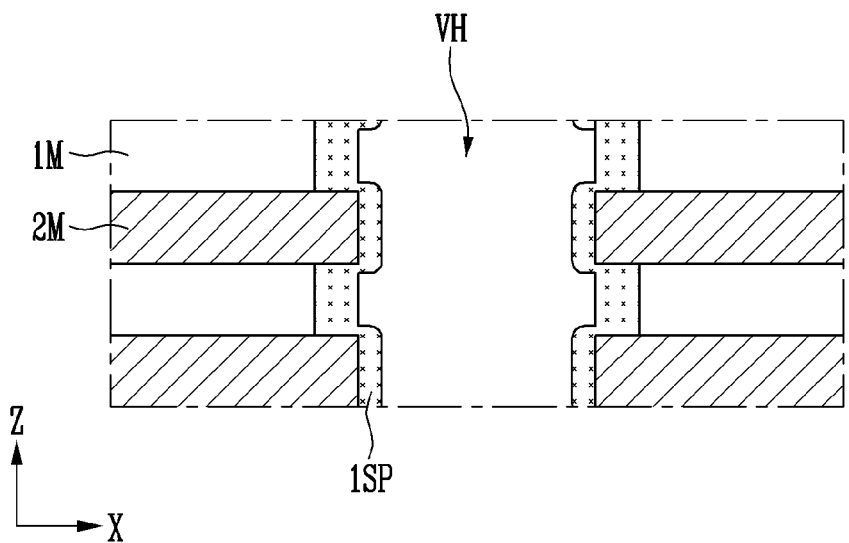
Figure 5D:
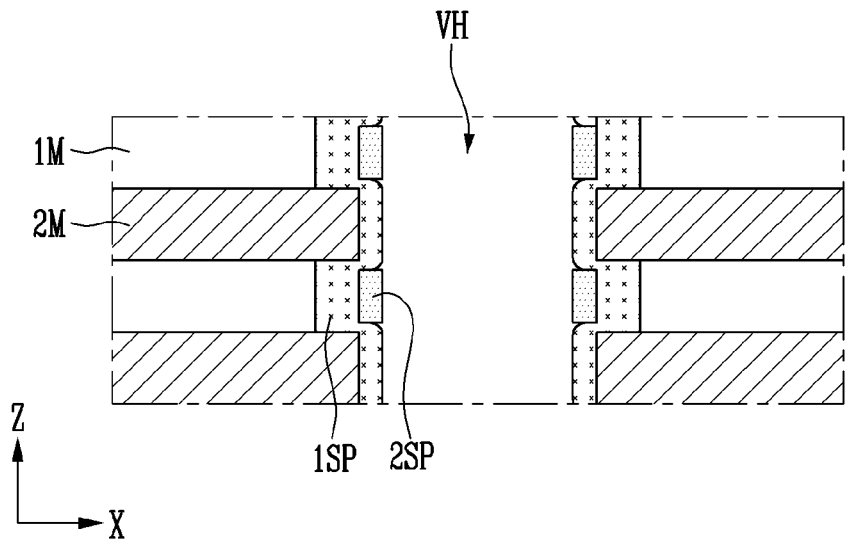
Figure 5E:
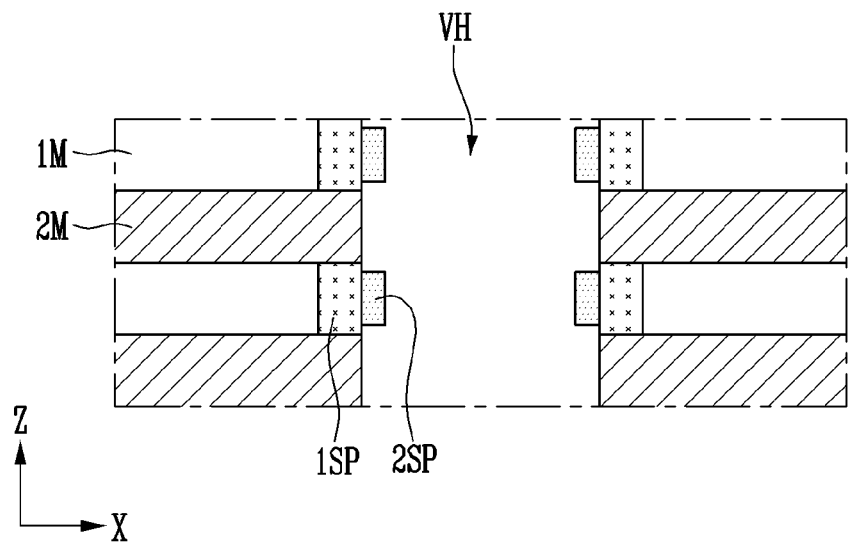
Figure 5F:
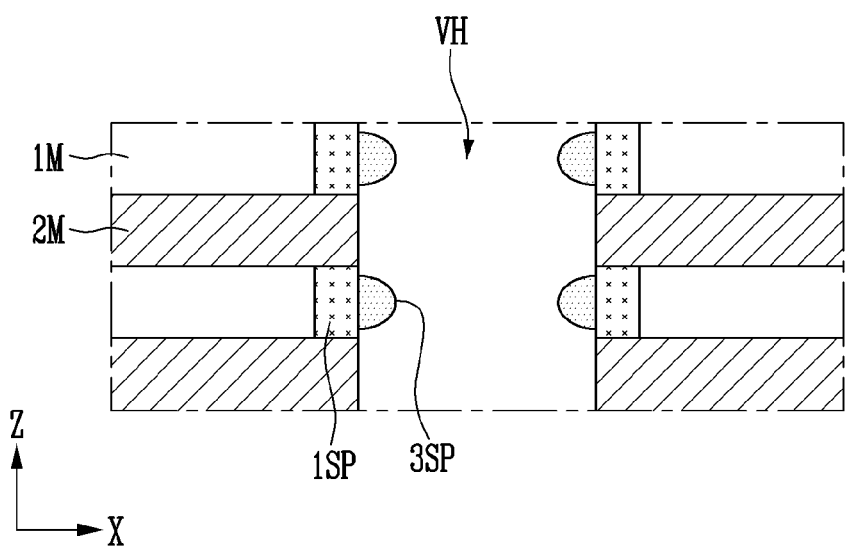
Figure 5G:
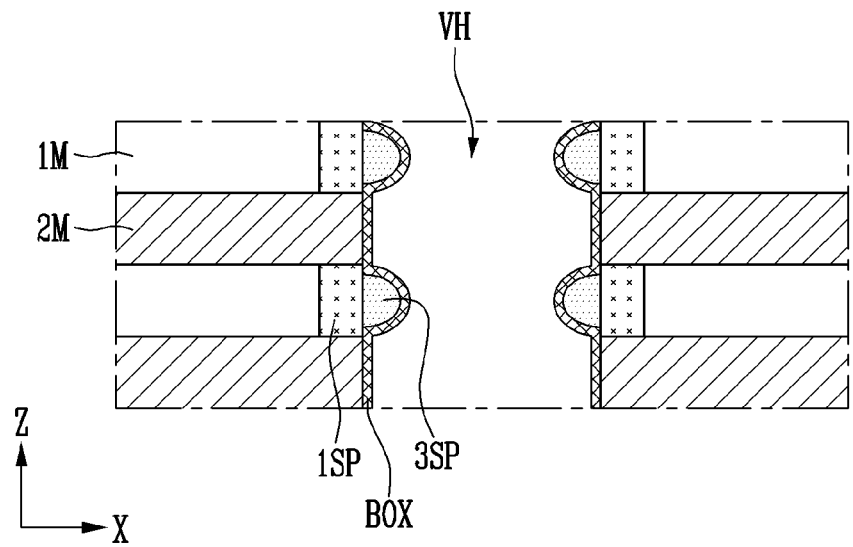
Figure 5H:
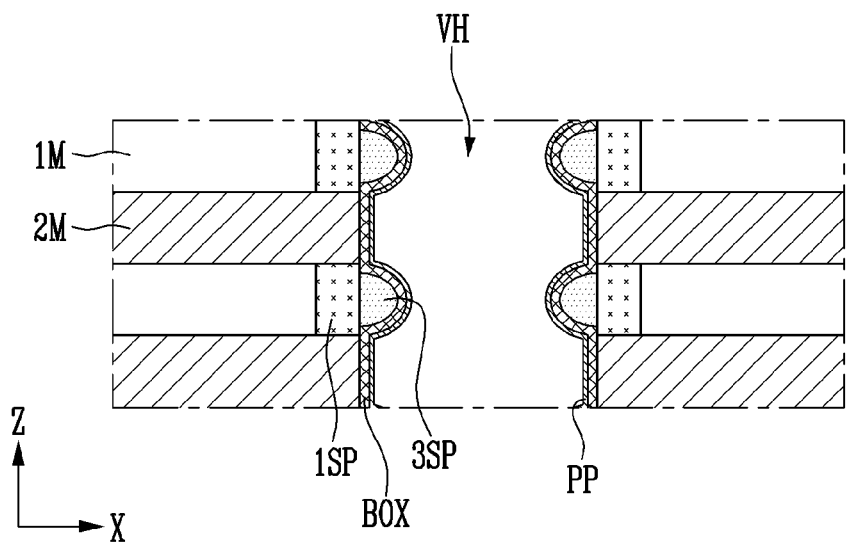
Figure 5I:
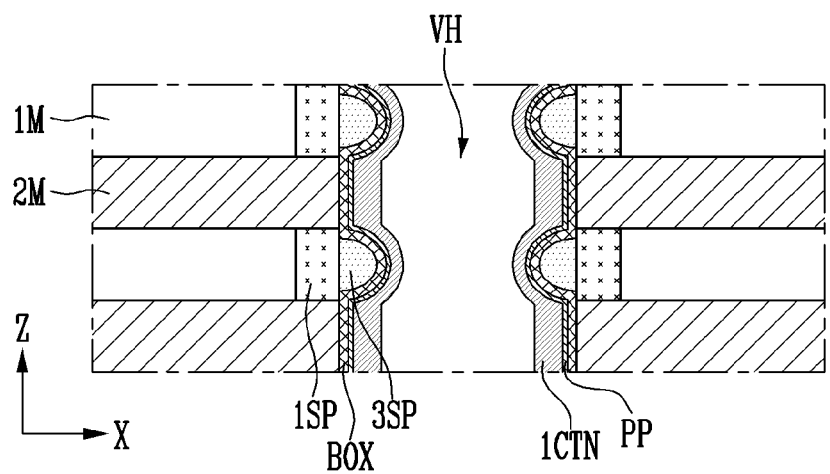
Figure 5J:
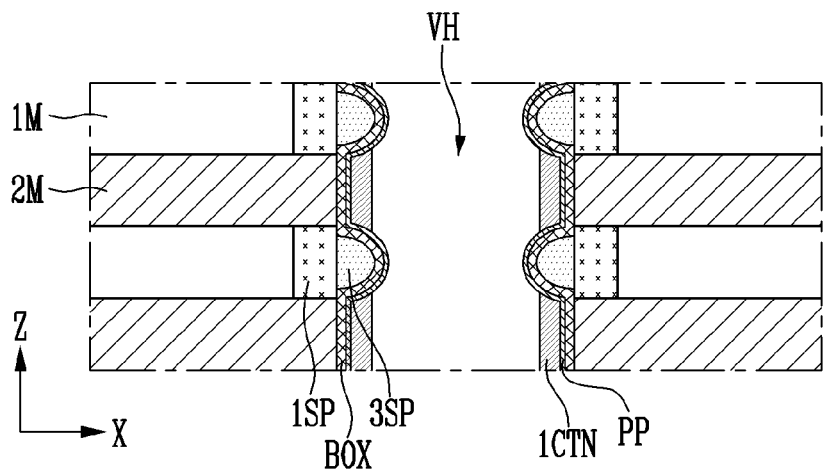
Figure 5K:
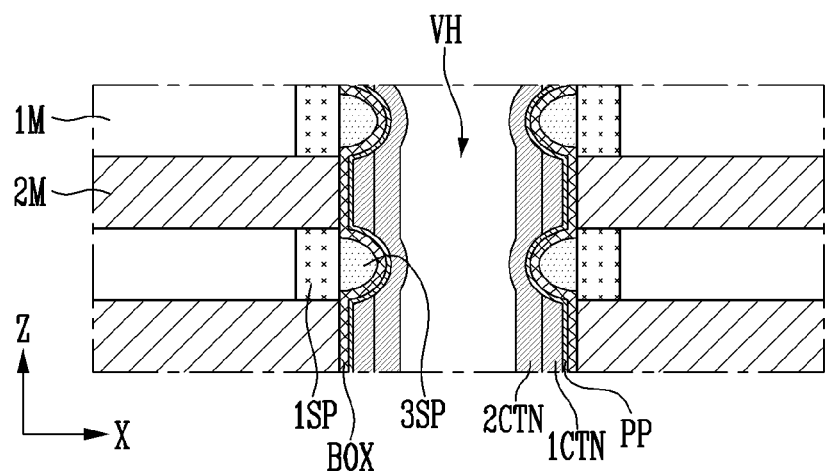
Figure 5L:
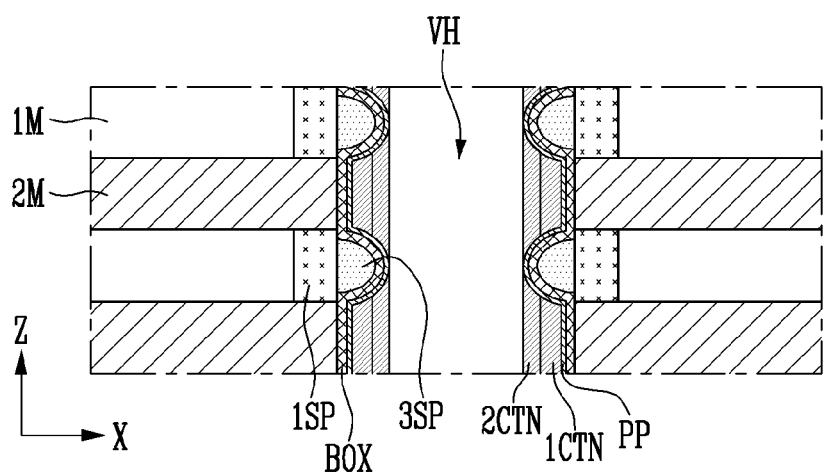
Figure 5M:
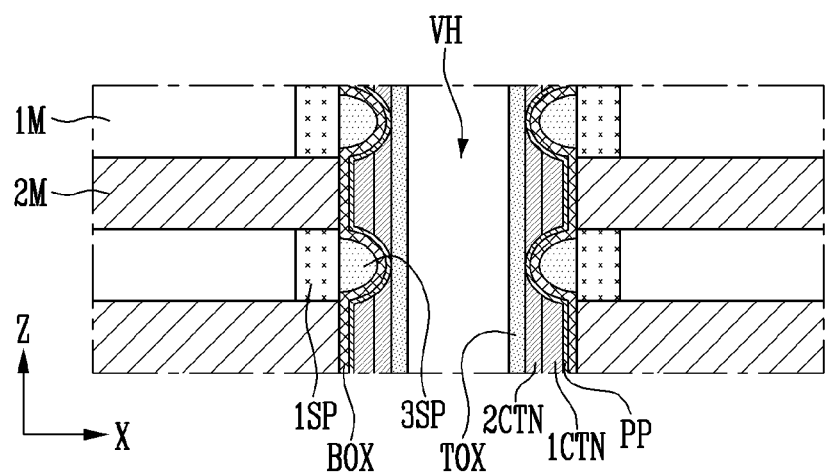
Figure 5N:
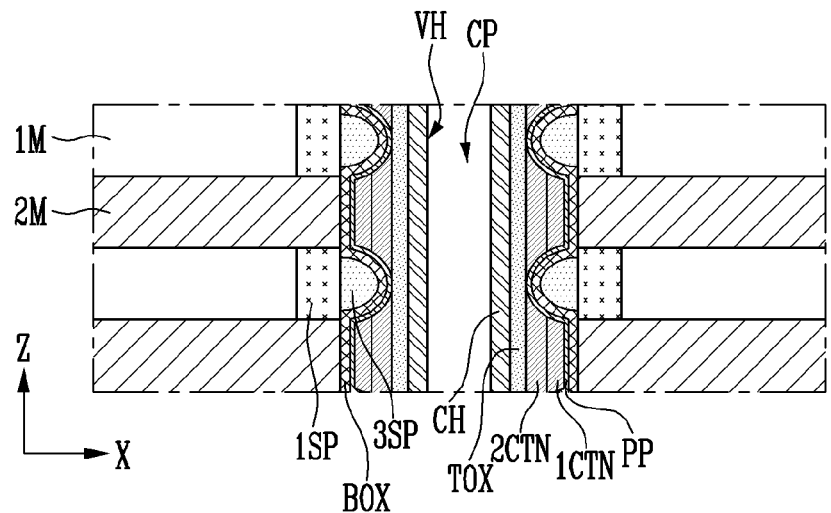
Figure 5O:
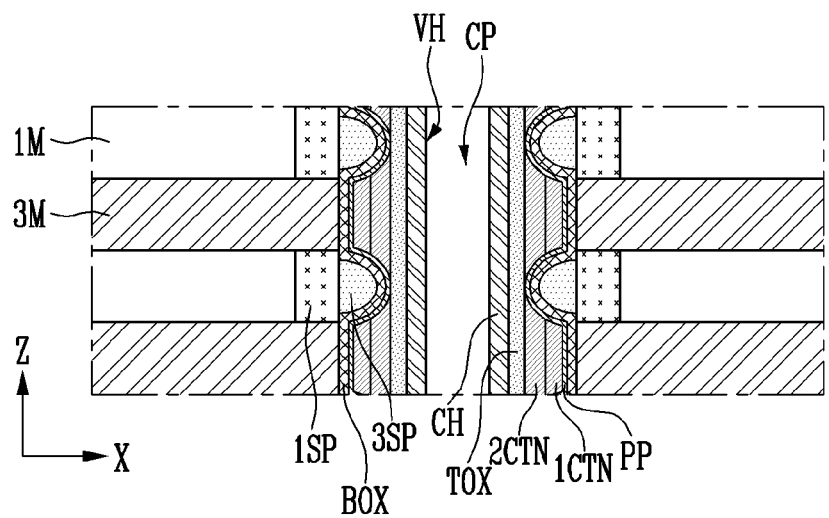

FIGS. 5A to 5O are sectional views illustrating a manufacturing method of a memory device in accordance with an embodiment of the present disclosure.

FIGS. 5A to 5O are enlarged views of a plug region (41 shown in FIG. 4).

Referring to FIG. 5A, a source layer (not shown) may be stacked on a lower structure (not shown). The lower structure (not shown) may be a structure including a substrate or peripheral circuits. Because the source layer (not shown) is a layer used as a source line, the source layer (not shown) may be formed of a conductive material. For example, the source layer (not shown) may be formed of a conductive material such as poly-silicon, tungsten or nickel. First and second material layers 1M and 2M may be alternately stacked on the top of the source layer (not shown). For example, when a first material layer 1M is formed on the top of the source layer (not shown), a second material layer 2M may be formed on the top of the first material layer 1M, and a first material layer 1M may be again formed on the top of the second material layer 2M. The first material layer 1M may be formed of an insulating material. For example, the first material layer 1M may be formed of an oxide layer or a silicon oxide layer. The second material layer 2M may be formed of a material which may be selectively removed in a subsequent process. Therefore, the second material layer 2M may be formed of a material having an etch selectivity different from an etch selectivity of the first material layer 1M. For example, the second material layer 2M may be formed of a nitride layer. A lowermost end and an uppermost end in a structure in which the first and second material layers 1M and 2M are stacked may be formed with the first material layer 1M. Accordingly, a stack structure may be formed.

A vertical hole VH extending in a vertical direction of the first and second material layers 1M and 2M may be formed inside the stack structure. An etching process for removing portions of the first and second material layers 1M and 2M may be performed to form the vertical hole VH. The vertical hole VH may be performed through a dry etching process to be formed in the first direction (e.g., the Z direction) vertical to the first and second material layers 1M and 2M. The vertical hole VH may be formed in a region for forming a plug. The first and second material layers 1M and 2M may be exposed through an inner surface of the vertical hole VH.

Referring to FIG. 5B, an etching process may be performed, in which portions of the first material layers 1M are removed in a direction in which the first material layers 1M become distant from the vertical hole VH, from inner walls of the first material layers 1M, which are exposed by the vertical hole VH. Because only portions of the first material layers 1M are removed, the second material layers 2M may be formed in a structure protruding in a direction in which inner walls of the second material layers 2M become close to the vertical hole VH as compared with the inner walls of the first material layers 1M. For example, a distance between an inner wall of each of the first material layers 1M and an inner wall of another first material layer 1M which the first material layer 1M faces may be formed longer than a distance between an inner wall of each of the second material layers 2M and an inner wall of another second material layer 2M which the second material layer 2M faces.

Referring to FIG. 5C, first isolation patterns 1SP may be formed along the inner walls of the first material layers 1M and the second material layers 2M, which are exposed by the vertical hole VH. Because the second material layers 2M protrudes in a direction in which the second material layers 2M become close to the vertical hole VH as compared with the first material layers 1M, the first isolation pattern 1SP may be formed to protrude in a direction in which the first isolation pattern 1SP becomes close to the vertical hole VH in a region corresponding to the second material layers 2M in the second direction (e.g., the X direction) vertical to the first direction. Also, the first isolation pattern 1SP may be formed to be depressed in a direction in which the first isolation pattern becomes distant from the vertical hole VH in a region corresponding to the first material layers 1M in the second direction (e.g., the X direction).

Referring to FIG. 5D, second isolation patterns 2SP may be formed in regions corresponding to the first material layers 1M in the second direction (e.g., the X direction) in which the first material layers 1M extend. Because the first isolation pattern 1SP protrudes in the direction in which the first isolation pattern 1SP becomes close to the vertical hole VH in the region corresponding to the second material layers 2M, the second isolation patterns 2SP may be formed to be spaced apart from each other in the first direction with a protrusion part of the first isolation pattern 1SP interposed therebetween The second isolation patterns 2SP may be formed to be in contact with an inner wall of the first isolation pattern 1SP. The second isolation patterns 2SP may be formed of a poly-silicon layer.

Referring to FIG. 5E, an etching process for removing a portion of the first isolation pattern 1SP, which further protrudes than inner walls of the second material layers 2M in a direction in which the first isolation pattern 1SP becomes close to the vertical hole VH may be performed. Only a portion of the first isolation pattern 1SP may remain such that the inner walls of the second material layers 2M and the inner wall of the first isolation pattern 1SP are parallel or aligned to each other in the first direction (e.g., the Z direction) vertical to the first material layer 1M through the etching process. The remaining first isolation patterns 1SP may be arranged to be spaced apart from each other in the first direction (e.g., the Z direction) with the second material layers 2M interposed therebetween. A distance between an inner wall of each of the first isolation patterns 1SP and an inner wall of another first isolation pattern 1SP which the first isolation pattern 1SP faces with the vertical hole VH interposed therebetween may be formed to overlap with a distance between an inner wall of each of the second material layers 2M and an inner wall of another second material layer 2M which the second material layer 2M faces with the vertical hole VH interposed therebetween. In an embodiment, a difference between the distance between the inner wall of each of the first isolation patterns 1SP and the inner wall of the another first isolation pattern 1SP which the first isolation pattern 1SP faces with the vertical hole VH interposed therebetween and the distance between the inner wall of each of the second material layers 2M and the inner wall of the another second material layer 2M which the second material layer 2M faces with the vertical hole VH interposed therebetween may be formed within 3 nm. Therefore, the second isolation patterns 2SP may be formed in a structure protruding in a direction in which the second isolation patterns 2SP become close to the vertical hole VH from the first isolation patterns 1SP.

Referring to FIG. 5F, third isolation patterns 3SP may be formed by oxidizing the second isolation patterns (2SP shown in FIG. 5E). The third isolation patterns 3SP may be formed in a structure protruding in a direction in which the third isolation patterns 3SP become close to the vertical hole VH from the first isolation patterns 1SP. The third isolation patterns 3SP may be formed of an insulating material. For example, the third isolation patterns 3SP may be formed of the same material as the first isolation patterns 1SP. For example, the third isolation patterns 3SP may be formed of a silicon oxide layer or other oxide layer.

Referring to FIG. 5G, a blocking layer BOX may be formed along inner walls of the third isolation patterns 3SP and the second material layers 2M, which are exposed to a side of the vertical hole VH. Because the third isolation patterns 3SP is formed in the structure protruding in the direction in which the third isolation patterns 3SP become close to the vertical hole VH from the first isolation patterns 1SP, the blocking layer BOX may be formed in a structure protruding in a direction in which the blocking layer BOX becomes close to the vertical hole VH in a region corresponding to the first material layers 1M.

Referring to FIG. 5H, a barrier layer PP may be formed along an inner wall of the blocking layer BOX. Because the blocking layer BOX is formed in the structure protruding in the direction in which the blocking layer BOX becomes close to the vertical hole VH in the region corresponding to the first material layers 1M, the barrier layer PP may also be formed in a structure protruding in a direction in which the barrier layer PP becomes close to the vertical hole VH in a region corresponding to the first material layers 1M.

Referring to FIG. 5I, a first charge trap layer 1CTN may be formed along an inner wall of the barrier layer PP. The first charge trap layer 1CTN may be formed of a material capable of storing charges, e.g., a nitride layer. Because the barrier layer PP is formed in the structure protruding in a direction in which the barrier layer PP becomes closer to the vertical hole VH in the region corresponding to the first material layers 1M in the second direction in which the first material layers 1M extend, the first charge trap layer 1CTN may also be formed in a structure protruding in a direction in which the first charge trap layer 1CTN becomes close to the vertical hole VH in a region corresponding to the first material layers 1M in the second direction in which the first material layers 1M extend. In the first charge trap layer 1CTN, a portion of the first charge trap layer 1CTN, which is formed between protrusion parts of the barrier layer PP is formed thicker than a portion of the first charge trap layer 1CTN, which is formed on the protrusion parts of the barrier layer PP.

Referring to FIG. 5J, an etching process for removing a portion of the first charge trap layer 1CTN, which protrudes toward the vertical hole VH may be performed. Because the barrier layer PP is formed of a material having an etch selectivity lower than an etch selectivity of the first charge trap layer 1CTN, the first and third isolation patterns 1SP and 3SP and the blocking layer BOX are protected by the barrier layer PP in the etching process. The etching process may be performed as a wet etching process. Because the wet etching process is an isotropic etching process, the first charge trap layer 1CTN exposed through the vertical hole VH may be removed with a uniform thickness. The etching process may be performed until a protrusion part of the barrier layer PP is exposed. When the portion of the first charge trap layer 1CTN, which protrudes toward the vertical hole VH, is removed, the first charge trap layer 1CTN may remain between the protrusion parts of the barrier layer PP. The remaining first charge trap layers 1CTN may be arranged to be spaced apart from each other with the protrusion part of the barrier layer PP interposed therebetween in the first direction (e.g., the Z direction). A thickness of the remaining first charge trap layer 1CTN may be formed thinner than the first charge trap layer 1CTN formed between the protrusion parts of the barrier layer PP shown in FIG. 5I.

Referring to FIG. 5K, a second charge trap layer 2CTN may be formed along inner walls of the barrier layer PP and the first charge trap layer 1CTN, which are exposed through the etching process of the first charge trap layer 1CTN. In the second charge trap layer 2CTN, a thickness of the first and second charge trap layers 1CTN and 2CTN formed between the protrusion parts of the barrier layer PP, may be formed thicker than a thickness of the first charge trap layer 1CTN formed between the protrusion parts of the barrier layer PP shown in FIG. 5I. Because the third isolation patterns 3SP are formed in a structure protruding in a region corresponding to the first material layers 1M in the second direction (e.g., the X direction) in which the first material layers 1M extend, the second charge trap layer 2CTN may be formed in a structure protruding in a direction in which the second charge trap layer 2CTN becomes close to the vertical hole VH from the first isolation pattern 1SP in a region corresponding to the first material layers 1M in the second direction.

As the second charge trap layer 2CTN is formed after the first charge trap layer 1CTN is formed, charge trap layers are formed several numbers of times. Thus, a process defect of the charge trap layers can be reduced, and the time taken in a process of forming the charge trap layers can be decreased.

Referring to FIG. 5L, an etching process of removing a portion of the second charge trap layer 2CTN, which protrudes toward the vertical hole VH, may be performed. Because the barrier layer PP is formed of a material having an etch selectivity lower than an etch selectivity of the second charge trap layer 2CTN, the first and third isolation patterns 1SP and 3SP and the blocking layer BOX are protected by the barrier layer PP in the etching process. When the portion of the second charge trap layer 2CTN, which protrudes toward the vertical hole VH, is removed, remaining second charge trap layers 2CTN may be arranged to be spaced apart from each other with the protrusion parts of the barrier layer PP interposed therebetween, in the first direction (e.g., the Z direction) vertical to the first material layers 1M. Because the protrusion part of the second charge trap layer 2CTN is removed, an outer wall of the vertical hole VH may be formed flat by the remaining second charge trap layer 2CTN and the barrier layer PP. The remaining first and second charge trap layers 1CTN and 2CTN may be formed thicker than the remaining first charge trap layer 1CTN shown in FIG. 5J. Although a case where a charge trap layer is formed twice is described in the above-described embodiment, the charge trap layer may be formed by performing the manufacturing processes described with reference to FIGS. 5J to 5L three times or more.

Referring to FIG. 5M, a tunnel insulating layer TOX may be formed along an inner wall of the remaining second charge trap layer 2CTN and an inner wall of the barrier layer PP. Because the outer wall of the vertical hole VH can be formed flat by the remaining second charge trap layer 2CTN and the barrier layer PP, the tunnel insulating layer TOX may be formed in an approximately linear shape extending in the first direction (e.g., the Z direction) vertical to the first material layers 1M. Because the tunnel insulating layer TOX is not filled in the vertical hole VH, the tunnel insulating layer TOX may be formed in a cylindrical shape. The tunnel insulating layer TOX may be formed of an insulating material. For example, the tunnel insulating layer TOX may be formed of an oxide layer or a silicon oxide layer.

Referring to FIG. 5N, a channel layer CH may be formed along an inner wall of the tunnel insulating layer TOX. The channel layer CH may be formed of a semiconductor material. For example, the channel layer CH may be formed of a poly-silicon layer. A core pillar CP may be filled in the channel layer CH formed along the inner wall of the tunnel insulating layer TOX.

Referring to FIG. 5O, the second material layer (2M shown in FIG. 5N) may be removed, and a third material layer 3M may be formed in a region in which the second material layer (2M shown in FIG. 5N) is removed. Specifically, an etching process for removing the second material layer (2M shown in FIG. 5N) through a trench type slit (not shown) may be performed. The etching process may be performed as a wet etching process using an etchant for allowing the first material layer 1M to remain and selectively removing the second material layer (2M shown in FIG. 5N). The third material layer 3M may be formed in the region in which the second material layer (2M shown in FIG. 5N) is removed. For example, the third material layer 3M to be formed between the first material layers 1M may be supplied through the trench type slit (not shown). Because the third material layer 3M is used as a gate line, the third material layer 3M may be formed of a conductive material. For example, the third material layer 3M may be formed of tungsten (W), cobalt (Co), nickel (Ni), molybdenum (Mo), silicon (Si), poly-silicon (poly-Si), or the like.

Figure 6:
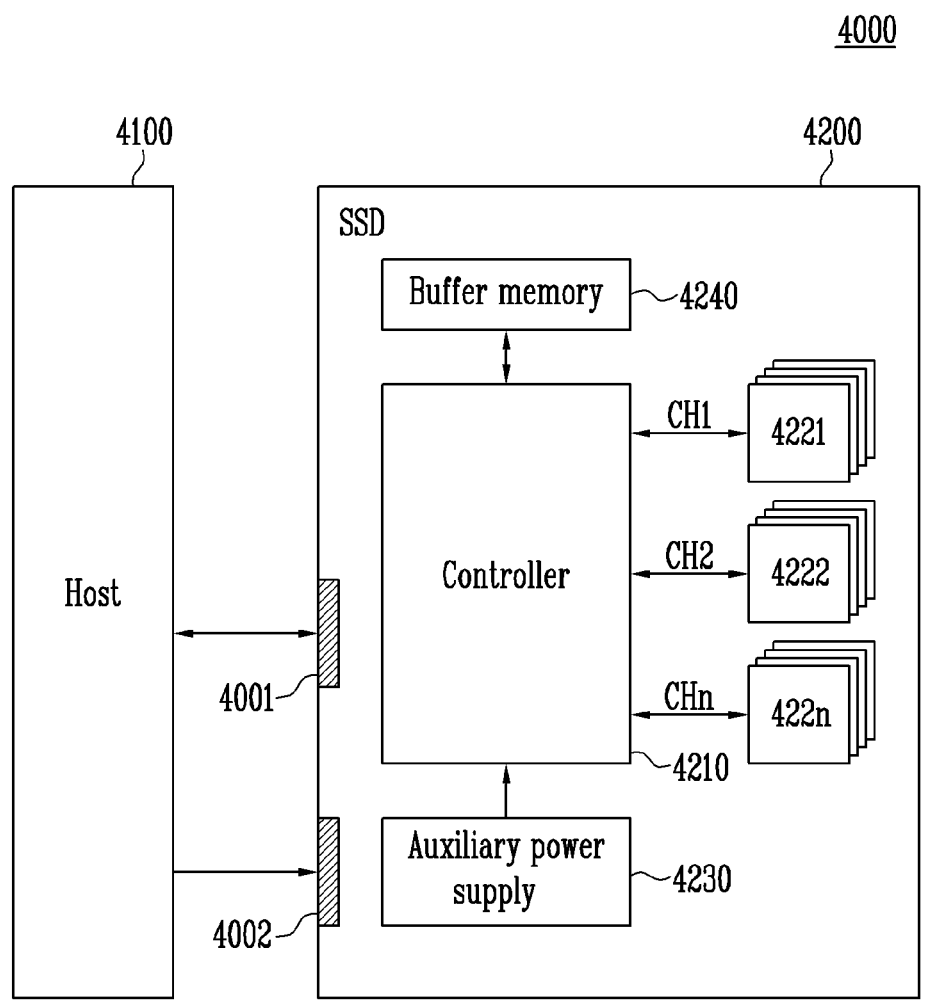
FIG. 6 is a diagram illustrating a Solid-State Drive (SSD) system to which a memory device of the present disclosure is applied.

FIG. 6 is a diagram illustrating a Solid-State Drive (SSD) system 4000 to which a memory device in accordance with the present disclosure is applied.

Referring to FIG. 6, the SSD system 4000 includes a host 4100 and an SSD 4200. The SSD 4200 may exchange a signal with the host 4100 through a signal connector 4001, and be supplied with power through a power connector 4002. The SSD 4200 includes a controller 4210, a plurality of memory devices 4221 to 422n, an auxiliary power supply 4230, and a buffer memory 4240.

The controller 4210 may control the plurality of memory devices 4221 to 422n in response to a signal received from the host 4100. For instance, the signal may be transmitted based on an interface between the host 4100 and the SSD 4200. For example, the signal may be defined by at least one of interfaces such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), a firewire, a Universal Flash Storage (UFS), a WI-FI, a Bluetooth, and an NVMe.

The plurality of memory devices 4221 to 422n may include a plurality of memory cells configured to store data. Each of the plurality of memory devices 4221 to 422n may be configured identically to the memory device 100 shown in FIG. 1. The plurality of memory devices 4221 to 422n may communicate with the controller 4210 through channels CH1 to CHn.

The auxiliary power supply 4230 may be connected to the host 4100 through the power connector 4002. The auxiliary power supply 4230 may receive power PWR input from the host 4100 and charge the power PWR. When the supply of power from the host 4100 is not smooth, the auxiliary power supply 4230 may provide power of the SSD 4200. Exemplarily, the auxiliary power supply 4230 may be located in the SSD 4200, or be located at the outside of the SSD 4200. For example, the auxiliary power supply 4230 may be located on a main board, and provide auxiliary power to the SSD 4200.

The buffer memory 4240 may be used as a buffer memory of the SSD 4200. For example, the buffer memory 4240 may temporarily store data received from the host 4100 or data received from the plurality of memory devices 4221 to 422n, or temporarily store metadata (e.g., a mapping table) of the plurality of memory devices 4221 to 422n. The buffer memory 4240 may include volatile memory such as DRAM, SDRAM, DDR SDRAM, LPDDR SDRAM, and GRAM or nonvolatile memory such as FRAM, ReRAM, STT-MRAM, and PRAM.

Figure 7:
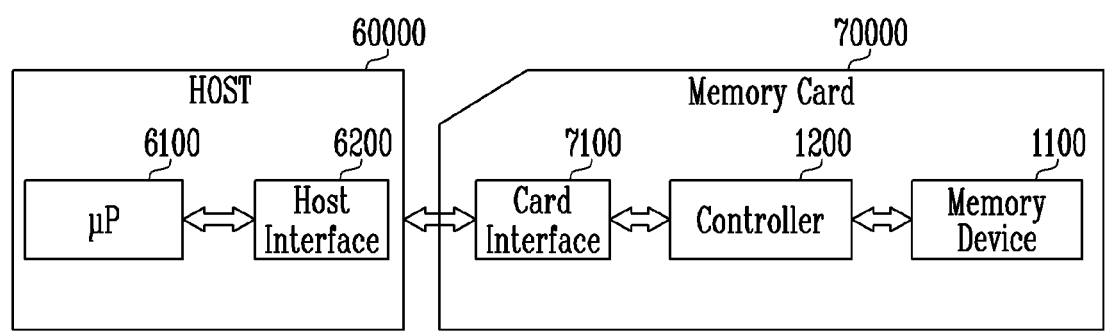
FIG. 7 is a diagram illustrating a memory card system to which a memory device of the present disclosure is applied.

FIG. 7 is a diagram illustrating a memory system to which a memory device in accordance with the present disclosure is applied.

Referring to FIG. 7, the memory system may be implemented as a memory card 70000. The memory card 70000 may include a memory device 1100, a controller 1200, and a card interface 7100.

The memory device 1100 may be configured identically to the memory device 100 shown in FIG. 1.

The controller 1200 may control data exchange between the memory device 1100 and the card interface 7100. In some embodiments, the card interface 7100 may be a secure digital (SD) card interface or a multi-media card (MMC) interface, but the present disclosure is not limited thereto.

The card interface 7100 may interface data exchange between a host 60000 and the controller 1200 according to a protocol of the host 60000. In some embodiments, the card interface 7100 may support a universal serial bus (USB) protocol and an inter-chip (IC)-USB protocol. The card interface 7100 may mean hardware capable of supporting a protocol used by the host 60000, software embedded in the hardware, or a signal transmission scheme.

When the memory card 70000 is connected to a host interface 6200 of the host 60000 such as a PC, a tablet PC, a digital camera, a digital audio player, a cellular phone, console video game hardware, or a digital set-top box, the host interface 6200 may perform data communication with the memory device 1100 through the card interface 7100 and the controller 1200 under the control of a microprocessor (μP) 6100.

In accordance with an embodiment of the present disclosure, the degree of integration of a memory device can be improved, a defect of the memory device can be reduced, and a process margin can be increased.

While the present disclosure has been shown and described with reference to certain embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described embodiments but should be determined by not only the appended claims but also the equivalents thereof.

In the above-described embodiments, all steps may be selectively performed or some of the steps may be omitted.

In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Meanwhile, the embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

What is claimed is:

1. A memory device comprising:
   a stack structure including alternately stacked first and second material layers;
   a vertical hole extending through the stack structure in a vertical direction;
   isolation patterns protruding from side surfaces of the first material layers formed inside the vertical hole;
   a blocking layer formed along surfaces of the protruding isolation patterns and the second material layers;
   a barrier layer formed along a surface of the blocking layer; and
   charge trap layers formed between protrusion parts of the barrier layer.

2. The memory device of claim 1, wherein a distance between the first material layers facing each other across the vertical hole is greater than a distance between the second material layers facing each other across the vertical hole.

3. The memory device of claim 2, wherein the isolation patterns include:
   first isolation patterns adjacent to inner walls of the first material layers and sidewalls of the second material layers; and
   second isolation patterns protruding from inner walls of the first isolation patterns.

4. The memory device of claim 3, wherein a difference between a distance between the first isolation patterns facing each other and the distance between the second material layers facing each other is within four nanometers (4 nm).

5. The memory device of claim 3, wherein a material constituting the second isolation patterns is the same as a material constituting the first isolation patterns.

6. The memory device of claim 3, wherein a distance between the second isolation patterns facing each other is less than the distance between the second material layers facing each other.

7. The memory device of claim 1, wherein a difference between a distance between the charge trap layers facing each other and a distance between the protrusion parts of the barrier layer facing each other is within three nanometers (3 nm).

8. The memory device of claim 1, further comprising a tunnel insulating layer and a channel layer formed along inner walls of the charge trap layers.

9. The memory device of claim 1, wherein the barrier layer comprises an insulating material.

10. The memory device of claim 1, wherein the barrier layer comprises a material having an etch selectivity lower than an etch selectivity of the charge trap layers in an etching process using hydrogen fluoride.

11. The memory device of claim 1, wherein the barrier layer comprises silicon oxycarbide (SiOC).

* * * * *